US005399459A

United States Patent [19]

Simpson et al.

[11] Patent Number: 5,399,459

[45] Date of Patent: Mar. 21, 1995

[54] THERMALLY BLEACHABLE DYES FOR LASER ABLATIVE IMAGING

[75] Inventors: William H. Simpson, Pittsford; Jacob J. Hastreiter, Jr., Spencerport, both of N.Y.

[73] Assignee: Eastman Kodak Company, Rochester, N.Y.

[21] Appl. No.: 143,325

[22] Filed: Oct. 26, 1993

[51] Int. Cl.[6] ............ G03C 5/16; G03F 7/36

[52] U.S. Cl. ............ 430/270; 430/201; 430/945

[58] Field of Search ............ 430/270, 495, 945, 200, 430/201; 503/227

[56] References Cited

U.S. PATENT DOCUMENTS

| | | | |
|---|---|---|---|
| Re. 29,168 | 4/1977 | Heseltine et al. | 430/522 |
| 4,270,130 | 5/1981 | Houle et al. | 430/945 |
| 4,360,908 | 11/1982 | Howe et al. | 346/135.1 |
| 4,412,231 | 10/1983 | Namba et al. | 430/945 |
| 4,600,625 | 7/1986 | Abe et al. | 430/495 |
| 4,656,121 | 4/1987 | Sato et al. | 430/945 |
| 4,713,314 | 12/1987 | Namba et al. | 430/495 |
| 4,900,648 | 2/1990 | Hioki et al. | 430/495 |
| 4,900,649 | 2/1990 | Mochizuki et al. | 430/270 |
| 4,914,001 | 4/1990 | Inagaki et al. | 430/270 |
| 4,973,572 | 11/1990 | DeBoer | 503/227 |
| 5,156,938 | 10/1992 | Foley et al. | 430/200 |
| 5,171,650 | 12/1992 | Ellis et al. | 430/20 |
| 5,278,023 | 1/1994 | Bills et al. | 430/270 |

*Primary Examiner*—Charles L. Bowers, Jr.
*Assistant Examiner*—Martin J. Angebranndt
*Attorney, Agent, or Firm*—Harold E. Cole

[57] ABSTRACT

A process of forming a single color, dye ablation image having a reduced D-min comprising imagewise-heating, by means of a laser, a dye-ablative recording element comprising a support having thereon a dye layer comprising an image dye dispersed in a polymeric binder having an infrared-absorbing material associated therewith, the laser exposure taking place through the dye side of the element, and removing the ablated image dye material by means of an air stream to obtain an image in the dye-ablative recording element, wherein the image dye is thermally bleachable and decomposes upon laser exposure.

8 Claims, No Drawings

THERMALLY BLEACHABLE DYES FOR LASER ABLATIVE IMAGING

This invention relates to use of thermally bleachable dyes in a laser dye ablative recording element.

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271, the disclosure of which is hereby incorporated by reference.

Another way to thermally obtain a print using the electronic signals described above is to use a laser instead of a thermal printing head. In such a system, the donor sheet includes a material which strongly absorbs at the wavelength of the laser. When the donor is irradiated, this absorbing material converts light energy to thermal energy and transfers the heat to the dye in the immediate vicinity, thereby heating the dye to its vaporization temperature for transfer to the receiver. The absorbing material may be present in a layer beneath the dye and/or it may be admixed with the dye. The laser beam is modulated by electronic signals which are representative of the shape and color of the original image, so that each dye is heated to cause volatilization only in those areas in which its presence is required on the receiver to reconstruct the color of the original object. Further details of this process are found in GB 2,083,726A, the disclosure of which is hereby incorporated by reference.

In one ablative mode of imaging by the action of a laser beam, an element with a dye layer composition comprising an image dye, an infrared-absorbing material, and a binder coated onto a substrate is imaged from the dye side. The energy provided by the laser drives off the image dye at the spot where the laser beam hits the element and leaves the binder behind. In ablative imaging, the laser radiation causes rapid local changes in the imaging layer thereby causing the material to be ejected from the layer. This is distinguishable from other material transfer techniques in that some sort of chemical change (e.g., bond-breaking), rather than a completely physical change (e.g., melting, evaporation or sublimation), causes an almost complete transfer of the image dye rather than a partial transfer. The transmission D-min density value serves as a measure of the completeness of image dye removal by the laser. In some cases, the residual, unablated dye is trapped either in residual melted binder or the film base making its removal extremely difficult.

U.S. Pat. No. 4,973,572 relates to infrared-absorbing cyanine dyes used in laser-induced thermal dye transfer elements. In Example 3 of that patent, a positive image is obtained in the dye element by using an air stream to remove sublimed dye. However, the image dyes disclosed in that patent produce D-min's which are relatively high, as will be shown by comparative tests hereafter.

U.S. Pat. No. 5,171,650 relates to an ablation-transfer image recording process. In that process, an element is employed which contains a dynamic release layer overcoated with an ablative carrier topcoat which contains a "contrast imaging material". An image is transferred to a receiver in contiguous registration therewith. The useful image obtained in this process is contained on the receiver element. There is no disclosure in that patent that a useful positive image can be obtained in the recording element or that the "contrast imaging material" should be a thermally bleachable dye.

U.S. Pat. No. 5,156,938 relates to the use of certain sensitizers and a "contrast imaging material" in a laser-absorbing coating in conjunction with a separate receiving element. However, there is no disclosure in that patent of a single sheet process or that the "contrast imaging material" should be a thermally bleachable dye.

It is an object of this invention to provide a process for increasing the writing speed and reducing the D-min obtained in a dye-ablative recording element. It is another object of this invention to provide a single sheet process which does not require a separate receiving element.

These and other objects are achieved in accordance with the invention which comprises a process of forming a single color, dye ablation image having a reduced D-min comprising imagewise-heating by means of a laser, a dye-ablative recording element comprising a support having thereon a dye layer comprising an image dye dispersed in a polymeric binder having an infrared-absorbing material associated therewith, the laser exposure taking place through the dye side of the element, and removing the ablated image dye material to obtain an image in the dye-ablative recording element, and wherein the image dye is thermally bleachable.

It has been found unexpectedly that providing a thermally bleachable image dye in the dye layer of the above dye-ablative recording element for laser ablative imaging significantly enhances the desired dye cleanout as evidenced by the resulting faster writing speeds to achieve a given minimum density.

Use of thermally bleachable dyes according to the invention which undergo rapid thermal bleaching at elevated temperatures produces a lower D-min and higher writing speed, since the colored dyes decompose to colorless products yielding a lower density. The combination of the ablation process with the use of thermally bleachable dyes allows one to obtain significantly increased writing speeds. It is believed that this improvement is brought about by the heat developed during the ablation process bleaching the thermally bleachable image dye which would otherwise remain at the exposed sites.

The dye ablation process of this invention can be used to obtain medical images, reprographic masks, printing masks, etc. The image obtained can be a positive or a negative image.

Any polymeric material may be used as the binder in the recording element employed in the process of the invention. For example, there may be used cellulosic derivatives, e.g., cellulose nitrate, cellulose acetate hydrogen phthalate, cellulose acetate, cellulose acetate propionate, cellulose acetate butyrate, cellulose triacetate, a hydroxypropyl cellulose ether, an ethyl cellulose ether, etc., polycarbonates; polyurethanes; polyesters; poly(vinyl acetate); polystyrene; poly(styrene-co-acrylonitrile); a polysulfone; a poly(phenylene oxide); a poly(ethylene oxide); a poly(vinyl alcohol-co-acetal) such as poly(vinyl acetal), poly(vinyl alcohol-co-butyral) or poly(vinyl benzal); or mixtures or copolymers thereof. In a preferred embodiment, the polymeric binder used in the recording element employed in the process of the invention has a polystyrene equivalent molecular weight of at least 100,000, as measured by size exclusion chromatography, as claimed in U.S. patent application Ser. No. 099,968 of Kaszczuk et al., filed Jul. 30, 1993. The binder may be used at a coverage of from about 0.1 to about 5 g/m$^2$.

In another preferred embodiment, the infrared-absorbing material employed in the recording element used in the invention is a dye which is employed in the image dye layer.

To obtain a laser-induced, dye ablative image using the process of the invention, a diode laser is preferably employed since it offers substantial advantages in terms of its small size, low cost, stability, reliability, ruggedness, and ease of modulation. In practice, before any laser can be used to heat a dye-ablative recording element, the element must contain an infrared-absorbing material, such as cyanine infrared-absorbing dyes as described in U.S. Pat. No. 4,973,572, or other materials as described in the following U.S. Pat. Nos.: 4,948,777, 4,950,640, 4,950,639, 4,948,776, 4,948,778, 4,942,141, 4,952,552, 5,036,040, and 4,912,083, the disclosures of which are hereby incorporated by reference. The laser radiation is then absorbed into the dye layer and converted to heat by a molecular process known as internal conversion. Thus, the construction of a useful dye layer will depend not only on the hue, transferability and intensity of the image dyes, but also on the ability of the dye layer to absorb the radiation and convert it to heat. The infrared-absorbing dye may be contained in the dye layer itself or in a separate layer associated therewith, i.e., above or below the dye layer. As noted above, the laser exposure in the process of the invention takes place through the dye side of the dye ablative recording element, which enables this process to be a single sheet process, i.e., a separate receiving element is not required.

Lasers which can be used in the invention are available commercially. There can be employed, for example, Laser Model SDL-2420-H2 from Spectra Diode Labs, or Laser Model SLD 304 V/W from Sony Corp.

Any dye can be used in the dye-ablative recording element employed in the invention provided it can be ablated by the action of the laser and is thermally bleachable. By thermally bleachable is meant that the dye undergoes a color to colorless transition upon heating by the absorbed laser energy. Examples of such dyes are disclosed in U.S. Pat. Nos. 3,269,839, 3,769,019, 4,081,278 and Re. 29,168. Especially good results have been obtained with thermally bleachable dyes which are of the cyanine or N-alkoxycarbocyanine dye class. The above dyes may be employed singly or in combination. The dyes may be used at a coverage of from about 0.05 to about 1 g/m$^2$ and are preferably hydrophobic.

In a preferred embodiment of the invention, the thermally bleachable dyes have the formula:

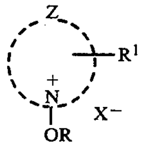

or

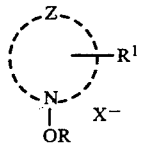

wherein: $R^1$ can be (a) a substituted or unsubstituted methine linkage terminated by a heterocyclic nucleus of the type contained in cyanine dyes, e.g., those set forth in Mees and James, "The Theory of the Photographic Process," MacMillan, 3rd ed., pp. 198–232; e.g., $—CH=$, $—C(CH_3)=$, $—C(C_6H_5)=$, $—CH=CH—$, $—CH=CH—CH=$, etc.;

(b) a substituted or unsubstituted alkyl group having from 1 to about 8 carbon atoms such as methyl, propyl, ethyl, butyl, sulfoalkyl, benzyl, or pyridinatooxyl-alkyl salt, e.g., $—(CH_2)_3—O—Y$ where Y is a substituted or unsubstituted pyridinium salt;

(c) a substituted or unsubstituted aryl group such as phenyl, naphthyl, tolyl, etc.;

(d) hydrogen;

(e) an acyl group having the formula

wherein $R^2$ is hydrogen or an alkyl group having from 1 to about 8 carbon atoms;

(f) an anilinovinyl group having the formula

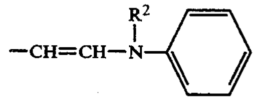

wherein $R^2$ is defined as above; or (g) a substituted or unsubstituted styryl group, e.g.;

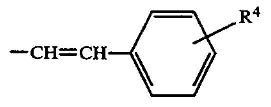

wherein $R^4$ is hydrogen, an alkyl group such as those defined above for $R^1$, an aryl group such as those defined above for $R^1$ or amino, including dialkylamino such as dimethylamino;

R can be:

(a) an alkyl group such as those defined above for $R^1$;

(b) an acyl group, e.g.;

wherein $R^5$ is an alkyl group having from 1 to about 8 carbon atoms or an aryl group, e.g., methyl, ethyl, propyl, butyl, phenyl, naphthyl, etc.; or (c) a substituted or unsubstituted aryl group such as those defined above for $R^1$;

Z represents the atoms necessary to complete a substituted or unsubstituted 5- to 6-membered heterocyclic nucleus, which nucleus can contain at least one additional hetero atom such as oxygen, sulfur, selenium or nitrogen, e.g. a pyridine nucleus, a quinoline nucleus, etc.; and $X^-$ represents an anion such as chloride, bromide, iodide, perchlorate, p-toluenesulfone, tetrafluoroborate, thiocyanate, methylsulfate, etc.

Specific examples of thermally bleachable dyes useful in the invention include the following:

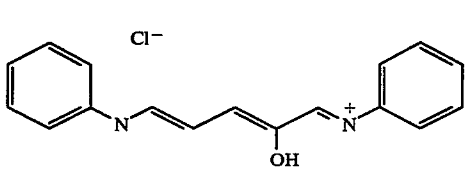

Dye 1
(Magenta)

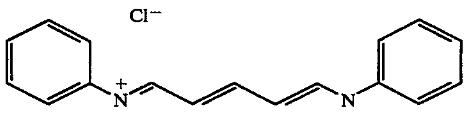

Dye 2
(Yellow)

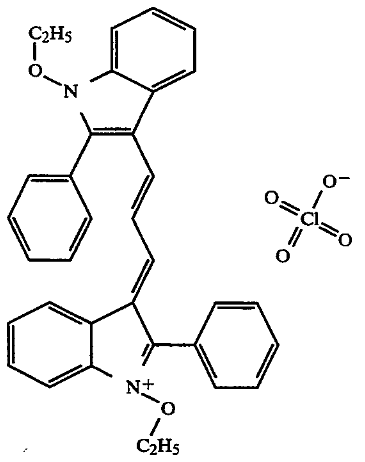

Dye 3
(Cyan)

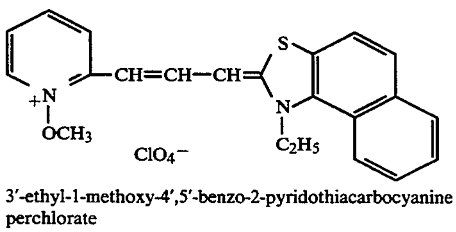

3'-ethyl-1-methoxy-4',5'-benzo-2-pyridothiacarbocyanine perchlorate

Dye 4
(Magenta)

-continued

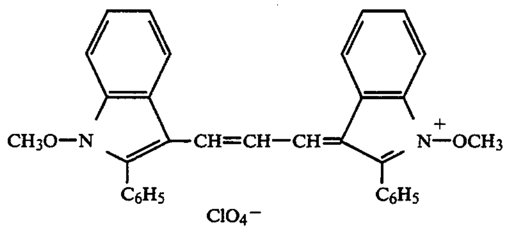

1,1'-dimethoxy-2,2'-diphenyl-3,3'-indolo-carbocyanine perchlorate

Dye 5
(Blue)

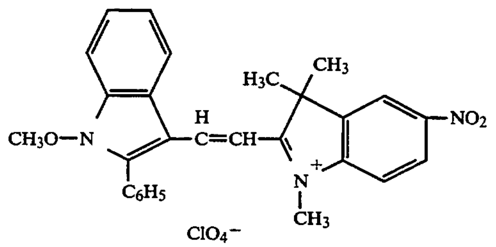

1'-methoxy-1,3,3-trimethyl-5-nitro-2'-phenylindo-3'-indolocarbocyanine perchlorate Dye 6
(Red)

The dye layer of the dye-ablative recording element employed in the invention may be coated on the support or printed thereon by a printing technique such as a gravure process.

Any material can be used as the support for the dye-ablative recording element employed in the invention provided it is dimensionally stable and can withstand the heat of the laser. Such materials include polyesters such as poly(ethylene naphthalate; poly(ethylene terephthalate); polyamides; polycarbonates; cellulose esters such as cellulose acetate; fluorine polymers such as poly(vinylidene fluoride) or poly(tetrafluoroethylene-cohexafluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 200 μm. It may also be coated with a subbing layer, if desired, such as those materials described in U.S. Pat. Nos. 4,695,288 or 4,737,486. In a preferred embodiment, the support is transparent.

The following examples are provided to illustrate the invention.

EXAMPLE 1

A) A control dye ablative recording element was prepared by coating on a 100 μm thick poly(ethylene terephthalate) support a dye layer of magenta Control Dye 1 illustrated below (0.38 $g/m^2$), IR-1 infrared-absorbing dye identified below (0.25 $g/m^2$) in a cellulose nitrate binder (1139 sec. viscosity)(Aqualon Co.)(0.75 $g/m^2$) from methanol and ethyl ethanoate.

B) A dye ablative recording element according to the invention was prepared similar to A) except that it contained magenta Dye 1 illustrated above at 0.38 $g/m^2$.

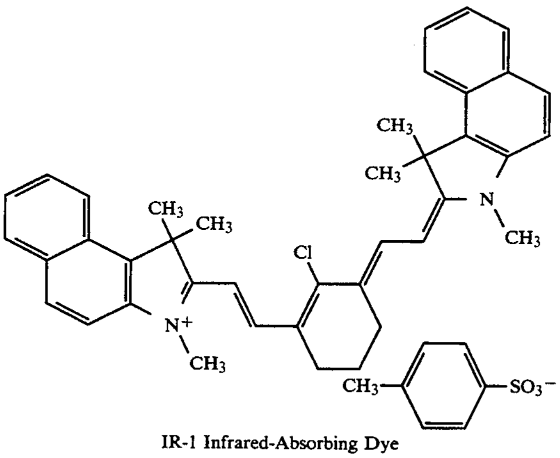

IR-1 Infrared-Absorbing Dye

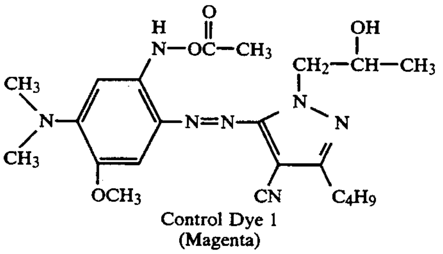

Control Dye 1
(Magenta)

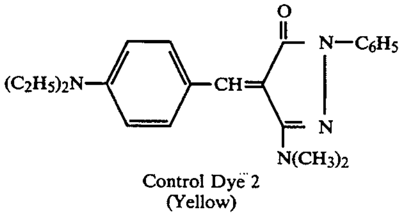

Control Dye 2
(Yellow)

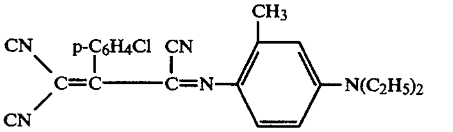

Control Dye 3
(Cyan)

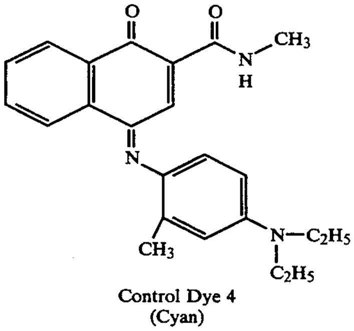

Control Dye 4
(Cyan)

The recording elements, 10×80 mm, were secured to the drum of a diode laser imaging device as described in U.S. Pat. No. 5,168,288 with the recording layer facing outwards. The laser imaging device consisted of a single diode laser connected to a lens assembly mounted on a translation stage and focused onto the surface of the laser ablative recording element. The diode lasers employed were Spectra Diode Labs No. SDL-2430, having an integral, attached optical fiber for the output of the laser beam with a wavelength range 800–830 nm and a nominal power output of 250 milliwatts at the end of the optical fiber. The cleaved face of the optical fiber (50 μm core diameter) was imaged onto the plane of the dye-ablative element with a 0.5 magnification lens assembly mounted on a translation stage giving a nominal spot size of 25 μm.

The drum, 53 cm in circumference, was rotated at varying speeds and the imaging electronics were activated to provide exposures at 415 mJ/cm$^2$ or 980 mJ/cm$^2$. The translation stage was incrementally advanced across the dye-ablative element by means of a lead screw turned by a microstepping motor, to give a center-to-center line distance of 10 μm (945 lines per centimeter, or 2400 lines per inch). An air stream was blown over the donor surface to remove the sublimed dye. The measured average total power at the focal plane was 130 mW.

Several rectangles were written, each with a different exposure, which was varied by changing drum revolutions per minute (rev/min). The Status A green minimum transmission densities (D-min), using a Status A Green Filter, recorded for a set of exposure values as expressed by the rev/min numbers in the data compilation shown in Table 1, are an average of five readings taken within each rectangle on an X-Rite densitometer Model 310 (X-Rite Co. Inc., Grandville, Mich.). An initial density was determined and recorded after drying of each coating, but prior to the writing process. The remaining density values shown in Table 1 were recorded at drum speeds of 100, 200, 400, and 600 rev/min, respectively, to demonstrate effects over a range of exposure times. The following results were obtained:

TABLE 1

| Dye in Element | Status A Filter | Initial Density | D-min at Rev/min 100 | 200 | 400 | 600 |
|---|---|---|---|---|---|---|
| Control Dye 1 | green | 2.76 | — | 0.16 | 0.12 | 0.29 |
| Dye 1 | green | 2.40 | 0.10 | 0.03 | 0.03 | 0.08 |

The above results show that the writing speed achieved with thermally bleachable Dye 1 is faster than that obtained with Control Dye 1, i.e., the lower D-min at a given rev/min means that a lower rev/min can be used to obtain any given D-min.

EXAMPLE 2

A control element was prepared using a red coating of Control Dye 1 (0.22 g/m$^2$) and Control Dye 2 (0.11 g/m$^2$) using Butvar B-98® poly(vinyl butyral) (Monsanto Co.) (0.56 g/m$^2$) as binder and IR-1 (0.25 g/m$^2$). An element according to the invention was prepared using a red coating made from thermally bleachable Dye 1 (0.38 g/m$^2$) and Dye 2 (0.19 g/m$^2$) with the same binder and the infrared-absorbing dye. These elements were tested in the same manner as in Example 1 with the following results:

TABLE 2

| Dye in Element | Status A Filter | Initial Density | D-min at Rev/min 100 | 200 | 400 | 600 |
|---|---|---|---|---|---|---|
| Control Dyes 1 and 2 | green | 2.41 | 1.10 | 0.41 | 0.80 | 2.09 |
| | blue | 2.49 | 1.35 | 0.57 | 1.04 | 2.31 |
| Dyes 1 and 2 | green | 3.06 | 0.28 | 0.17 | 0.20 | 0.78 |
| | blue | 2.87 | 0.30 | 0.21 | 0.29 | 0.60 |

The above results show that use of the thermally bleachable dyes according to the invention gave significantly faster writing speeds as compared to the conventional thermal dyes in a poly(vinyl butyral) binder. It should be noted that the starting density of the thermally bleachable dye combination was higher.

EXAMPLE 3

Example 2 was repeated except that cellulose nitrate (0.75 $g/m^2$) was used as the binder material, Control Dye 1 was coated at 0.38 $g/m^2$ and Control dye 2 was coated at 0.19 $g/m^2$. The following results were obtained:

TABLE 3

| Dye in Element | Status A Filter | Initial Density | D-min at Rev/min 100 | 200 | 400 | 600 |
|---|---|---|---|---|---|---|
| Control | green | 2.42 | 0.65 | 0.28 | 0.33 | 0.56 |
| Dyes 1 and 2 | blue | 2.11 | 0.80 | 0.40 | 0.43 | 0.67 |
| Dyes 1 | green | 2.95 | 0.14 | 0.10 | 0.13 | 0.22 |
| and 2 | blue | 2.03 | 0.33 | 0.20 | 0.27 | 0.38 |

Again, improvements in writing speed were realized when thermally bleachable dyes were used in place of conventional thermal dyes with a binder of cellulose nitrate.

EXAMPLE 4

This example illustrates the synergistic effect of the combination of an ablation process and the use of thermally bleachable dyes.

An element was prepared as in Example 1 by first coating on the support a layer containing Dye 1 (0.20 $g/m^2$), Dye 2 (0.12 $g/m^2$), IR-1 and cellulose nitrate as the binder. The element was divided. Onto one piece was coated a second layer of polystyrene (Scientific Polymer Products, Inc.) at a coating weight of 7.5 $g/m^2$. The overcoat was used to prevent ablation of the image dyes and to allow one to evaluate the writing speed due to use of the thermal bleachable dyes alone. The other element was used as before and represents the results obtained using ablation imaging and thermally bleachable dyes. The elements were then processed as in Example 1 with the following results:

TABLE 4

| Element | Status A Filter | Initial Density | D-min at Rev/min 100 | 200 | 400 | 600 |
|---|---|---|---|---|---|---|
| without | green | 2.10 | 0.10 | 0.03 | 0.03 | 0.12 |
| overcoat | blue | 1.95 | 0.36 | 0.12 | 0.12 | 0.22 |
| with | green | 1.90 | 0.19 | 0.21 | 0.26 | 0.77 |
| overcoat | blue | 1.84 | 0.55 | 0.62 | 0.72 | 1.08 |

The above results show that the first element which involved ablation processing and the use of thermally bleachable dyes had a faster writing speed than the second element which shows the effect of using only thermally bleachable dyes. These results indicate that the improvement observed is due to the combination of ablation processing and the use of thermally bleachable dyes.

EXAMPLE 5

Example 4 was repeated except for using Dye 3 which is cyan in color (0.11 $g/m^2$). The following results were obtained:

TABLE 5

| Element | Status A Filter | Initial Density | D-min at Rev/min 100 | 200 | 400 | 600 |
|---|---|---|---|---|---|---|
| without overcoat | red | 1.06 | 0.23 | 0.13 | 0.13 | 0.22 |
| with overcoat | red | 1.04 | 0.42 | 0.39 | 0.57 | 0.81 |

The above results again show that the first element which involved ablation processing and the use of a thermally bleachable cyan dye had a faster writing speed than the second element which shows the effect of using only a thermally bleachable dye.

EXAMPLE 6

A control black element was prepared as in Example 1 but using Control Dye 1 (0.37 $g/m^2$), Control Dye 2 (0.21 $g/m^2$), Control Dye 3 (0.05 $g/m^2$) and Control Dye 4 (0.11 $g/m^2$), with a cellulose nitrate binder and IR-1. A black element according to the invention was prepared using thermally bleachable dyes, Dye 1 (0.20 $g/m^2$), Dye 2 (0.16 $g/m^2$) and Dye 3 (0.20 $g/m^2$), with the same binder and infrared absorber. The combination of dyes is used to form a black imaging material.

The elements were tested as in Example 1 with the following results:

TABLE 6

| Dyes in Element | Status A Filter | Initial Density | D-min at Rev/min 100 | 200 | 400 | 600 |
|---|---|---|---|---|---|---|
| Control | green | 2.56 | 0.16 | 0.19 | 1.18 | 2.30 |
| Dyes 1, | blue | 2.42 | 0.23 | 0.28 | 1.27 | 2.28 |
| 2, 3, 4 | red | 1.09 | 0.09 | 0.12 | 0.56 | 0.99 |
| Dyes | green | 2.98 | 0.12 | 0.14 | 0.86 | 1.67 |
| 1, 2, 3 | blue | 2.86 | 0.23 | 0.25 | 0.97 | 1.69 |
| | red | 1.01 | 0.16 | 0.19 | 0.52 | 0.76 |

The above results show that the writing speed of the black coating which contains thermally bleachable dyes is faster than that of the control element containing conventional thermal dyes for the three color channels measured.

The invention has been described in detail with particular reference to preferred embodiments thereof, but it will be understood that variations and modifications can be effected within the spirit and scope of the invention.

What is claimed is:

1. A process of forming a single color, dye ablation image having a reduced D-min comprising imagewise-heating, by means of a laser, a dye-ablative recording element comprising a support having thereon a dye layer comprising an image dye dispersed in a polymeric binder having an infrared-absorbing material associated therewith, said laser exposure taking place through the dye side of said element, and removing the ablated image dye material by means of an air stream to obtain said image in said dye-ablative recording element, wherein said image dye is thermally bleachable and decomposes upon said laser exposure.

2. The process of claim 1 wherein said thermally bleachable image dye is a cyanine or N-alkoxycarbocyanine dye.

3. The process of claim 1 wherein said thermally bleachable image dye has the formula:

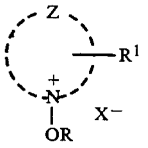

or

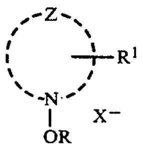

wherein: $R^1$ can be (a) a substituted or unsubstituted methine linkage terminated by a heterocyclic nucleus;

(b) a substituted or unsubstituted alkyl group having from 1 to about 8 carbon atoms;

(c) a substituted or unsubstituted aryl group;

(d) hydrogen;

(e) an acyl group having the formula

wherein $R^2$ is hydrogen or an alkyl group having from 1 to about 8 carbon atoms;

(f) an anilinovinyl group having the formula

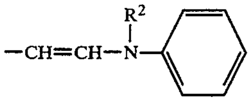

wherein $R^2$ is defined as above; or (g) a substituted or unsubstituted styryl group; R can be:

(a) a substituted or unsubstituted alkyl group having from 1 to about 8 carbon atoms;

(b) an acyl group;

wherein $R^5$ is an alkyl group having from 1 to about 8 carbon atoms or an aryl group; or (c) a substituted or unsubstituted aryl group;

Z represents the atoms necessary to complete a substituted or unsubstituted 5- to 6-membered heterocyclic nucleus; and $X^-$ represents an anion.

4. The process of claim 1 wherein said polymeric binder is a cellulosic derivative.

5. The process of claim 4 wherein said cellulosic derivative is cellulose nitrate.

6. The process of claim 1 wherein said infrared-absorbing material is contained in said dye layer.

7. The process of claim 6 wherein said infrared-absorbing material is a dye.

8. The process of claim 1 wherein said support is transparent.

* * * * *